(12) United States Patent
Fenger et al.

(10) Patent No.: US 7,893,743 B2
(45) Date of Patent: Feb. 22, 2011

(54) CONTROLLED POWER CONVERTER

(75) Inventors: Lars Rosenkvist Fenger, Copenhagen (DK); Jesper Lind Hansen, Rødovre (DK)

(73) Assignee: Pascal A/S, Herlev (DK)

( * ) Notice: Subject to any disclaimer, the term of this patent is extended or adjusted under 35 U.S.C. 154(b) by 33 days.

(21) Appl. No.: 12/442,691

(22) PCT Filed: Sep. 28, 2007

(86) PCT No.: PCT/DK2007/050132
§ 371 (c)(1),
(2), (4) Date: Jul. 10, 2009

(87) PCT Pub. No.: WO2008/037261
PCT Pub. Date: Mar. 4, 2008

(65) Prior Publication Data
US 2010/0013534 A1 Jan. 21, 2010

(30) Foreign Application Priority Data
Sep. 28, 2006 (DK) ............................... 2006 01247

(51) Int. Cl.
*H03K 7/08* (2006.01)
(52) U.S. Cl. .................... 327/172; 330/10; 330/251; 330/207 A
(58) Field of Classification Search ......... 327/172–177; 330/10, 149, 251, 207 A
See application file for complete search history.

(56) References Cited

U.S. PATENT DOCUMENTS

| 6,249,182 | B1 | 6/2001 | Pullen |
| 6,297,692 | B1 | 10/2001 | Nielsen |
| 6,300,825 | B1 | 10/2001 | Dijkmans et al. |
| 6,441,685 | B1 * | 8/2002 | MacMillan ............. 330/10 |
| 7,002,406 | B2 * | 2/2006 | Risbo et al. ............ 330/10 |
| 7,629,840 | B2 * | 12/2009 | Midya et al. .......... 330/10 |
| 7,683,707 | B2 * | 3/2010 | Ljusev et al. ........... 330/10 |
| 2005/0017799 | A1 * | 1/2005 | Risbo et al. ............ 330/10 |

(Continued)

FOREIGN PATENT DOCUMENTS

JP            56039606 A        4/1981

(Continued)

*Primary Examiner* — Lincoln Donovan
*Assistant Examiner* — William Hernandez
(74) *Attorney, Agent, or Firm* — Butler, Snow, O'Mara, Stevens & Cannada PLLC

(57) ABSTRACT

A pulse modulated converter comprising an input stage (1) for generating a first control signal (2) based on an input signal (3) and a first feedback signal (4), and a comparator (5) for generating a pulse width modulated signal (6) based on said first control signal and a reference signal (7), means for providing a hysteresis when generating the pulse width modulated signal (6), a power stage (8) for generating an amplified pulse width modulated signal (9), an output filter (10) for filtering said amplified pulse width modulated signal (9), so as to create an analog output signal (11). In said pulse modulated converter, the first feedback signal (4) is formed as a combination of a second feedback signal (12) and a third feedback signal (13). The second feedback signal (12) is derived from the amplified pulse width modulated signal (9) using a first predetermined transfer function (14). The third feedback signal (13) is derived from the analog output signal (11) using a second predetermined transfer function (15). The second predetermined transfer function (15) comprises at least one zero.

12 Claims, 5 Drawing Sheets

U.S. PATENT DOCUMENTS

2007/0008031 A1* 1/2007 Kranz .................. 330/10
2007/0096812 A1* 5/2007 Lee .................. 330/251

FOREIGN PATENT DOCUMENTS

| WO | 2001/71905 | A2 | 9/2001 |
| WO | 2004/100356 | A2 | 11/2004 |
| WO | 2007/099442 | A1 | 9/2007 |

* cited by examiner

CONTROLLED POWER CONVERTER

FIELD OF INVENTION

This invention relates to a pulse modulated converters, more specifically but not exclusively a pulse modulated converter comprising an input stage for generating a first control signal based on an input signal and a first feedback signal, and a comparator for generating a pulse width modulated signal based on said first control signal and a reference signal, means for providing a hysteresis when generating the pulse width modulated signal, a power stage for generating an amplified pulse width modulated signal, an output filter for filtering said amplified pulse width modulated signal, so as to create an analog output signal. The invention especially relates to amplification of signals by switching amplifiers such as Pulse Width Modulated (PWM) amplifier types.

TECHNICAL BACKGROUND OF THE INVENTION

The first PWM amplifiers comprised triangular generators. The triangular signal from the triangular generator is typically compared to an input signal by a comparator forming a PWM signal on the output of said comparator. This is the typical textbook example when designing a switching amplifier. One such prior art amplifier is described in US-A-2004/0846281.

The triangular generator approach has several drawbacks. The modulator has typically not any feedback correction, leading to the derived PWM signal comprising the non-linearities of the triangular generator. If a control loop is applied to the amplifier it will be restricted in bandwidth and loop gain in order to comply to the Nyquist stability criteria. This results in high levels of distortion along with a high load dependency of the closed loop transfer function of the amplifier.

As an alternative to using a triangular generator, some prior art PWM amplifiers use instead a self-oscillating modulator. Self-oscillating modulators eliminate major disadvantages of the triangular generator pulse width modulation. This is due to the increased level of bandwidth and loop gain that these modulators possess because of less restrictions to the Nyquist stability criteria.

The modulator and control system in a switching amplifier defines parameters such as THD+n (Total Harmonic Distortion plus noise), Intermodulation distortion, closed loop −3 db bandwidth, step response capability, load dependency, load step response, output impedance etc.

One known way of achieving a self-oscillating modulator is to use a self-oscillating local loop modulator.

Self-oscillating local loop modulator- and control systems comprising only a local loop can be seen from several documents, such as U.S. Pat. No. 6,300,825. In this context the term "local loop" is to be understood as a feedback loop where the feedback signal is derived before the output filter.

These types of modulators lacks the controlling capability of the demodulation filter in the power converter resulting in high levels of e.g. output impedance and distortion defined mainly by the non-linearities of the output filter component.

Another known way of achieving a self-oscillating modulator is to use a self-oscillating global loop modulator. In this context the term "global loop" is to be understood as a feedback loop where the feedback signal is derived after the output filter.

Self-oscillation global loop modulation comprising modulators in a single global loop has an advantage on lower output impedance, better step responses and has the potential for better modulator linearity. Such a modulator can be seen from the patent application "Global loop integrating modulator" international publication number WO-A-2004/100356. These types of modulators have the disadvantage that the sensitivity is in some cases a trade off with the modulator linearity. In order to obtain higher sensitivity the global loop can be cascaded as nested loops, resulting however at the same time in a compromise on load step- and transient stability capability.

Typically, ordinary non-oscillating global loop feedbacks, as disclosed in WO-A-01/71905, generally exhibit lower error suppression capability of an applied local modulator loop and at the same time reduces the loadstep and step response capabilities resulting in a trade-off between sensitivity of the global loop and stability, as compared to self oscillating control systems. The overall compromise will result in a system with high output impedance and low load step and input step capabilities.

Output residuals will be fed into the local loop modulator by the global loop resulting in modulator distortion. This type of system has also got a large switch frequency variation resulting in very low switching frequencies at high output amplitudes of the amplifier. Such a system has been described in U.S. Pat. No. 6,297,692.

OBJECTS OF THE INVENTION

It is the overall object of the invention to overcome the drawbacks of prior art modulator and control systems, as described above.

A first object of the invention is to provide a modulator with a high level of linearity in order to reduce the total amount of distortion provided by the power amplifier.

A second object of the invention is to provide a control and modulator system obtaining a very low error sensitivity by the global loop.

A third object is to provide an extremely simple modulator and control structure as a non-cascaded system capable of obtaining a suitable low error sensitivity.

A fourth object of the invention is to decrease the switching frequency variation so that the power converter has a higher switch frequency at high modulation indexes resulting in better utilisation of the power supply rail voltage on the output of the amplifier and less switching frequency dependence to the loading of the power converter.

A fifth object is to reduce the power consumed by the zöbel resistor in the applied zöbel network and thereby reduce the physical size of the components and at the same time obtaining a very stable control and modulator system.

SUMMARY OF THE INVENTION

The above objects are obtained by a novel pulse modulated converter and control system according to the invention.

According to the invention there is provided a pulse modulated converter comprising an input stage for generating a first control signal based on an input signal and a first feedback signal, and a comparator for generating a pulse width modulated signal based on said first control signal and a reference signal, means for providing a hysteresis when generating the pulse width modulated signal, a power stage for generating an amplified pulse width modulated signal, an output filter for filtering said amplified pulse width modulated signal, so as to create an analog output signal, wherein said first feedback signal is formed as a combination of a second feedback signal and a third feedback signal, said second feedback signal being derived from the amplified pulse width modulated signal using a first predetermined transfer function, and said third feedback signal being derived from the analog output signal using a second predetermined transfer function, where said second predetermined transfer function comprises at least one zero.

In other words, according to the invention two feedback signals are used. First signal is a voltage or current feedback signal, which is measured at the amplifier power stage, the other signal is a voltage feedback signal, which is measured at the amplifier output, i.e. before and after the output filter respectively. The signals are summed together, whereby a linear modulation as well as a very high loop gain and a low output impedance is obtained.

The modulating behaviour is obtained by loop instability defined by the forward path comprising the regulator, the comparator, the hysteresis loop, the power stage, the demodulation filter and feedback loops comprising a local loop having a first predetermined transfer function and a global loop having a second predetermined transfer function.

The total loop gain in the pass-band of the amplifier is mainly determined by the global loop whereas the modulator linearity is mainly determined by the high frequency summation of the local loop and the global loop. This provides an applied control system obtaining very low distortion, low output impedance, linear frequency response along with a low noise floor and a high Power Supply Rejection Ratio (PSRR).

A hysteresis loop mainly controls the switching frequency of the amplifier along with the pole and zero placement in the regulator and in the local and global loop transfer functions. The hysteresis loop is applied in order to reduce the switching frequency sufficiently to an area, where acceptable efficiency can be obtained, but most importantly to be able to obtain linear modulation of the power stage output signal.

The modulator and control system provides variable switching frequency obtaining better efficiency along with a spread high frequency noise spectrum. The switching frequency variation is limited in this type of modulator resulting in that the amplifier is capable of running at very large modulation indexes utilizing the power supply rail extensively.

The modulator- and control system can be implemented as a very non-complex system, with very few components. Due to the high level of stability of the modulator and control system the Zöbel network can be reduced significantly, leading to higher efficiency and physically smaller components in the Zöbel network.

The regulator in the forward path of the amplifier can be, but is not limited to, an integrator. The local loop signal contribution to the feedback summation point of the amplifier can preferably be dominant at high frequencies as compared to the global loop, whereas the global loop can preferably due to its transfer function be dominant at lower frequencies, thus obtaining linear modulation and thereby lowered THD+n.

Due to high global loop gain around the filter cut-off frequency the small signal bandwidth can be extended much further than the cut off frequency of the output filter. This also means that the demodulation filter cut off frequency can be close to the amplifier audio frequency band, thus reducing the residual ripple on the output of the amplifier.

The amplifier will in the given implementation act close to an ideal voltage generator.

The global feedback loop feeding back the output signal from the output of the amplifier will mainly define the output impedance of the power converter especially if the local feedback loop feeding back the power stage output signals has a transfer function with a low gain in the amplifier pass band implemented, corresponding to a high pass filter or a high resistive impedance level as compared to the impedance of the global loop.

Uncritically summing the signal from the output of the power stage with the output signal of the amplifier and lowpass filtering these signals will result in a "partial current drive" of the amplifier, resulting in prohibitive output impedance. An uncritical summation of local and global loop signals will further result in a non-linear control signal. This will result in increased levels of distortion. In order to avoid a non-linear control signal the poles and zeroes implemented in the regulator, the predetermined transfer functions of local and global loops, respectively, and the output filter poles must be placed carefully in frequency along with the hysteresis loop gain and the Q-factor of the output filter in order to obtain a linear or close to linear control signal.

Preferred embodiments of the invention implementing advantageous careful placement of poles and zeroes are subject of the dependent claims.

The control signal is the signal present on the input of the comparator, this signal is compared to a reference level, which is typically the ground level. The comparison results in a pulse signal on the output of the comparator. The signals comprised in said pulse signal, within the pass-band of the amplifier should be the same as the signals comprised in the control signal at frequencies within the pass-band of the amplifier.

OUTLINE OF DRAWINGS

A brief description of the drawings is given below. FIGS. 1 to 3 show prior art systems and FIGS. 5 to 8 show preferred embodiments of the present invention.

PREFERRED EMBODIMENTS

Figure 1:
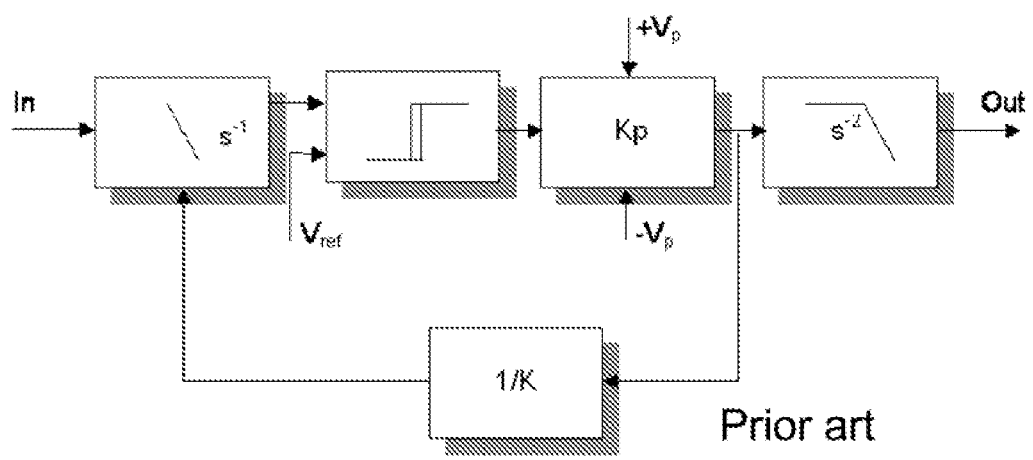
FIG. 1 shows a prior art local loop integrating modulator.
Figure 2:
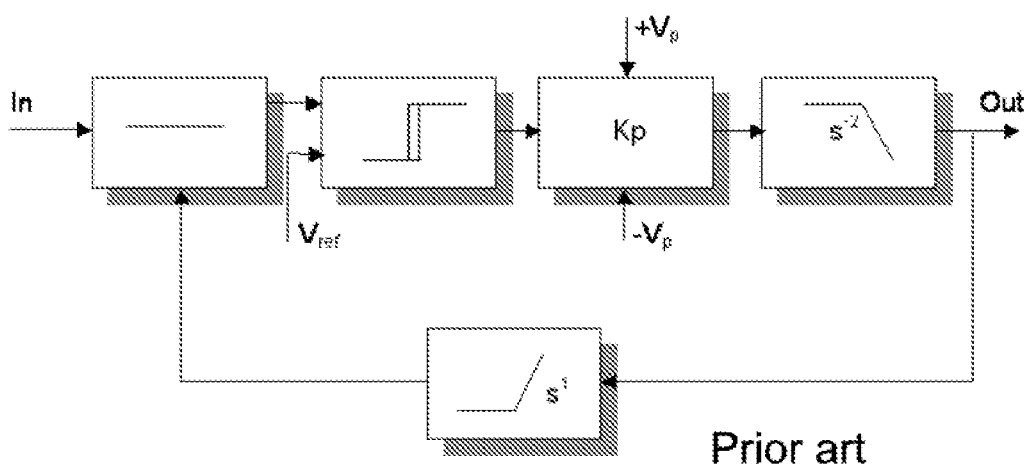
FIG. 2 shows a prior art Global Loop Integrating Modulator.
Figure 3:
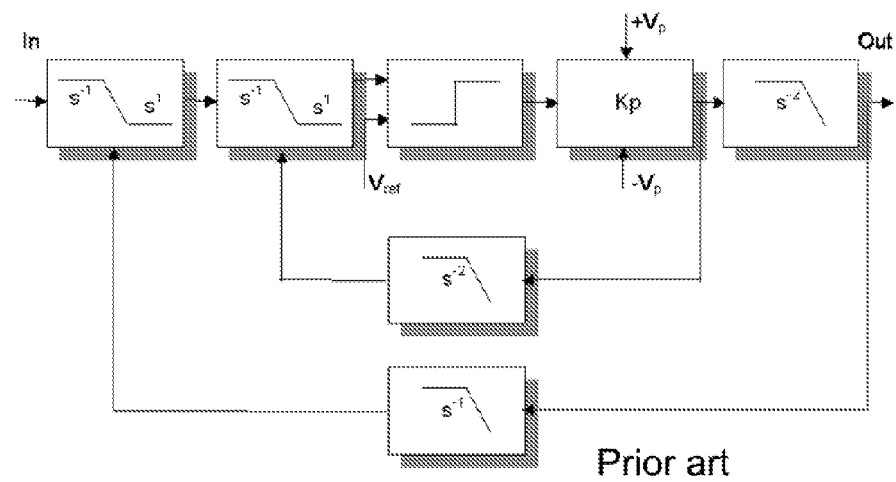
FIG. 3 shows a prior art multi-loop cascaded control system.

FIGS. 4 to 8 show the preferred embodiments of the invention.

The blocks in the drawings shows preferred transfer functions. $S^{-1}$ describes a pole placed in the transfer function, $S^{-2}$ describes two poles placed in the transfer function, $S^{1}$ is a zero placed in the transfer function. Typically combinations of zeroes and poles can be combined to obtain other slopes, than the ones described above. Kp is a constant. Blocks comprising $S^{-1}$, $S^{-2}$, $S^{1}$ or $S^{2}$ can also comprise a gain factor along with said poles or zeroes.

Figure 4:
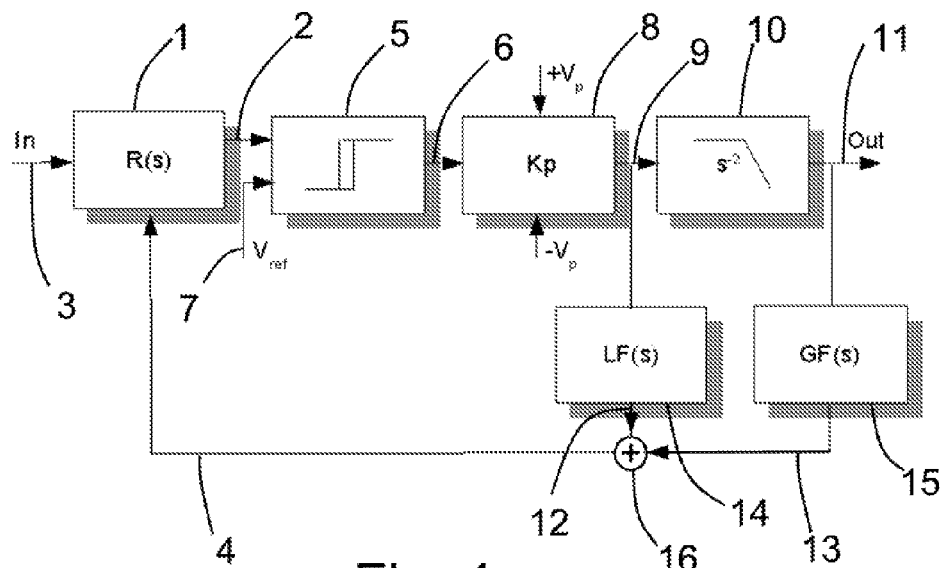
FIG. 4 shows a first embodiment a pulse modulated converter according to the invention as a general block diagram, describing the architecture of the complete control loop and modulator structure.

A first embodiment of the invention can be seen from FIG. 4 as a general block diagram of the pulse modulated converter implemented as an amplifier, comprising control and modulator means.

The pulse modulated converter in FIG. 4 comprises an input signal 3 (In), which is fed into a regulator 1. The regulator 1 can preferably be an integrator or at least comprise a pole. The output signal of the regulator 1 is hereafter termed as the modulating signal or first control signal 2.

The first control signal 2 is fed to a comparator 5 comparing it to a reference signal 7, such as a reference level (Vref). The comparator 5 for comparing the first control signal 2 to a reference level (Vref) may preferably also incorporate a hysteresis loop for reducing the switching speed and for being able to obtain linear modulation. The comparator 5 forms a pulse signal, such as but not limited to a pulse width modulated signal 6 on the output of said comparator 5.

The pulse modulated converter further comprises a power stage 8, which is controlled by the pulse width modulated signal 6 output of the comparator 5. The power stage 8 amplifies said pulse width modulated signal 6 in amplitude, thereby providing an amplified pulse width modulated signal 9 at the output thereof. The amplified pulse width modulated signal 9 is fed to an output filter 10, which is used for demodulation of the amplified pulse width signal 9 from the power stage 8. The output filter 10 demodulates the amplified pulse width modulated signal from the preceding power stage 8, providing an analog output signal 11, such as a sinusoid output signal (Out).

The output filter 10 is preferably a 2nd order LC low pass filter and has preferably, but not limited to a Butterworth, Bessel implementation, or alternatively but not limited thereto, a 2nd order high filter Q implementation.

At a summation point 16 preceding the regulator 1 a first feedback signal 4 is formed from a second feedback signal 12 and a third feedback signal 13.

In order to do so, a local loop voltage feedback is used, feeding the power stage output signal 9 from the output of the power stage 8 back through a first predetermined transfer function LF(s) 14 as the first feedback signal 12 to the summation point 16. Similarly, a global feedback is used, feeding the analog output signal 11 from the output filter 10 back through a second predetermined transfer function GF(s) 15, as the third feedback signal 13 to said summation point 16. The summation point thus forms the first feedback signal 4 as the summed feedback signal from both the local and global loop.

Said first feedback signal from said summation point 16 is fed back to the regulator 1 having a predetermined transfer function R(s), and subtracted from the input signal (In). Error correction of any non-linearity in the forward path comprising regulator 1, comparator 5, power stage 8 and output filter 10 is obtained by the negative feedback through the first predetermined transfer function and the second predetermined transfer function, i.e. the local and global loop transfer functions. The transfer function R(s) of the regulator 1 is applied in order to have a global loop gain, which is as high as possible, since the open loop gain is inverse proportional to the error sensitivity of the amplifier constituted by the pulse modulated converter. The regulator 1 will therefore have as much gain as possible within different frequency bands, while still obtaining the loop instability oscillation at −180 degrees of phase lag.

The first predetermined transfer function 14 of the local loop can comprise at least a pole or at least a zero or at least a gain factor, as can be seen from FIGS. 5 to 8, in which functionally similar or identical element have same reference symbols.

Figure 9:
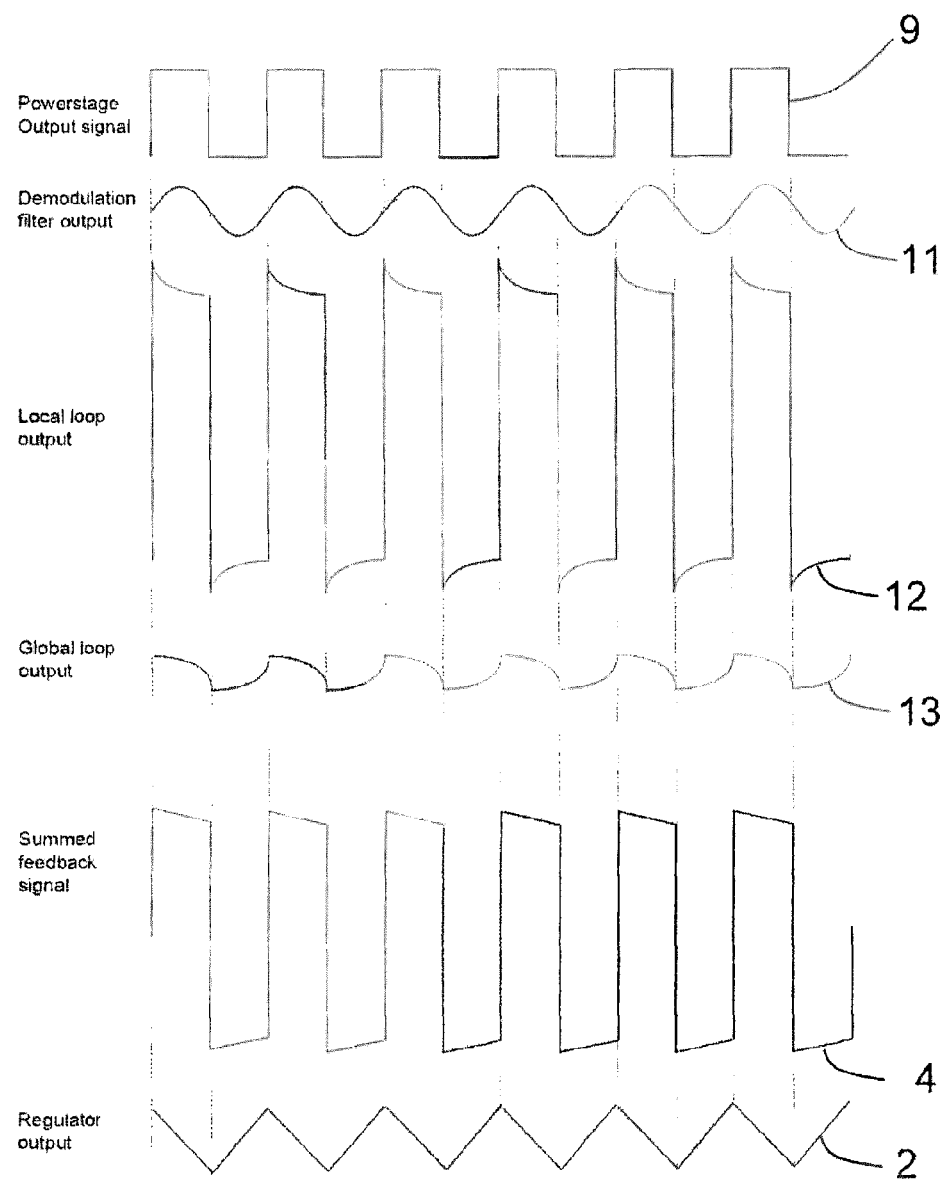
FIG. 9 shows waveforms of signals at various points in the pulse modulated converter of FIG. 5.

The second predetermined transfer function 15 of the global loop transfer, can comprise at least a zero in order to lead the open global loop transfer function sufficiently in order to keep the system stable. The poles and zeroes in the first predetermined transfer function 14 and the second predetermined transfer function 15, i.e. the local and global loop transfer functions LF(s) and GF(s) should be placed so that the high frequency signal components from the local and the global loop sum together to provide a linear control signal 2 as a modulating signal for the comparator 5. This can be obtained with different predetermined transfer functions in the local loop as well as the global loop. In order to obtain linear modulation, the control signal 2 should preferably have triangular shape, as can be seen in FIG. 9. The triangular shape can be obtained by adjusting the geometrical shape of the high frequency signals summed into the summation point 16 or to have a 1st order transfer function in the summed open loop transfer function from the poles and zeroes in the area of the switching frequency. Uncritically summing the high frequency signals will result in non-linear modulation.

Modulator linearity is defined by that the output of the regulator 1 must have a triangular shape or an asymmetrical shape, like an RC filtered PWM signal. In praxis signals might deviate slightly from the ideal signal shapes illustrated in FIG. 9. In particular the triangular shape of the output signal 2, may not be an ideal triangle. In praxis there is a trade off between linearity of the regulator output signal 2, and global open-loop transfer function gain. The regulator output signal 2 may deviate from a triangular shape, in order to increase the open-loop transfer function gain, which compensates for the non-linearity in the regulator output signal 2.

The skilled person will see that each of the first predetermined transfer function 14 and the second predetermined transfer function 15 will have to comprise a gain below 0 dB in order to have a stable system.

Figure 5:
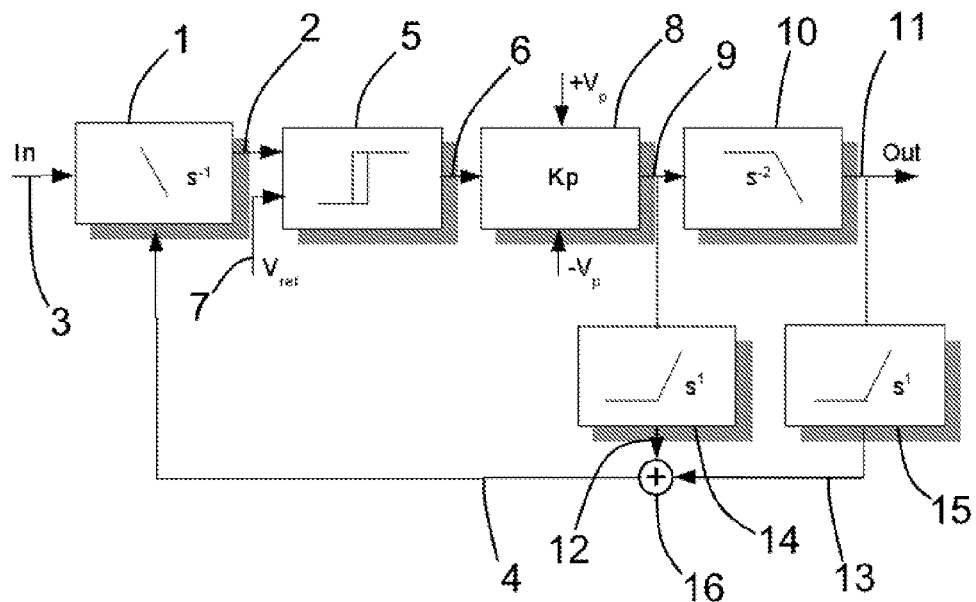
FIG. 5 shows a second embodiment of a pulse modulated converter according to the invention as a general block diagram, which in general terms describes the transfer functions of the complete control loop and modulator structure.

A second preferred embodiment of the invention can be seen from FIG. 5. Both the first predetermined transfer function 14 and the second predetermined transfer function 15 of the local feedback loop and the global feedback loop, respectively, have been implemented with at least a zero. The regulator 1 is preferably an integrator, but could have other low-pass filtering functions. The regulator 1 increases the summed open loop gain, defined by the path from input 2 (In), through the regulator 1, through the comparator 5, through the power stage 8, through the output filter 10, through first transfer function 14 and the second transfer function 15 of the local and global loops to the summation point 4, thus reducing any possible error sources of the forward path defined by the regulator 1, the comparator 5, the power stage 8 and the output filter 10.

The comparator 5 has been implemented with a hysteresis loop in order to reduce switching frequencies. The output of the comparator 5 is preferably a pulse width modulated signal. The hysteresis loop is preferably formed by positive feedback of the comparator output 6 or by positive feedback of the pulse width modulated signal 6 to the input of the comparator 5. The hysteresis loop enables the possibility for linear modulation.

The pulse width modulated signal 6 is fed to the power stage 8 and amplified in amplitude. The power stage 8 can comprise a half-bridge or a number of half-bridges and be supplied by one or several power supply rails. The amplified pulse width modulated signal, output by the power stage 8, is applied to the output filter 10 for demodulation.

The output filter 10 is preferably a 2nd order LC low pass filter.

The zeroes in the first predetermined transfer function 14 and the second predetermined transfer function 15 of the local- and the global loop can be but are not limited to being placed at coinciding frequencies. This results in a close to linear modulation due to the geometrical high frequency summation of the respective first and second feedback signals 12 and 13, as seen in FIG. 9.

The output impedance is lowered by the introduction of a zero in the first predetermined transfer function 14 of the local loop due to high local loop impedance in the amplifier passband. Due to the high global loop gain in this configuration, the output filter cut-off frequency can be placed close to the pass-band of the amplifier. Any output filter roll-off will be compensated. The small signal amplitude characteristics will be flat in the pass-band and will in a typical design have a $-3$ dB limit at around 50 kHz.

By the introduction of zeroes in first predetermined transfer function 14 and in the second predetermined transfer function 15 of the local and global loop, respectively, the following will apply. From the output of the power stage 8 to the feedback summation point 4 there will be two paths. One is through the local loop and one is through the output filter 10 of preferably 2nd order and the global loop. The signal in the feedback summation point 4 is subtracted from the input signal 3 and passes through the regulator 1, where it forms the control signal 2 on the output of the regulator 1. The local loop will then have a dominant high frequency transfer function signal contribution to the feedback summation point 4, whereas the path comprising the output filter 10 and the global loop will have a dominant low frequency signal contribution transfer function signal contribution to the feedback summation point 4. In FIG. 9 the signal contribution from the path comprising the output filter and the global loop in idle can be seen as (GF), whereas the local loop signal contribution can be seen as (LF). In this respect, idle is to be understood as without any input signal 3 applied to the regulator.

Moreover, in FIG. 9 the resulting control signal 2 on the output of the regulator 1 can be seen.

This means that the first predetermined transfer function 14 of the local loop will contribute to the control signal 2 with a high frequency amplitude, which is at a high amplitude, and a low frequency amplitude, which is at a low amplitude. Preferably, a summed 1st order open loop function can be obtained in the frequency domain.

The loop path through the output filter 10 and through second predetermined transfer function 15 of the global loop has a high amplitude level for low frequency signals, whereas it has a low amplitude level for high frequency signals. This means that the local loop only has a limited effect on the total sensitivity function of the amplifier within the pass-band of the amplifier.

In effect, the local loop supports the global loop in modulator linearity and enables the design of the global loop to have as much global open loop gain as possible. In principle the second predetermined transfer function 15 of the global open loop can be of at least 2nd order enabling very high open global loop gain, while at the same time linearised modulation from the high frequency summation of the local loop feedback signal 12 and the global loop feedback signal 13 is obtained.

Figure 6:
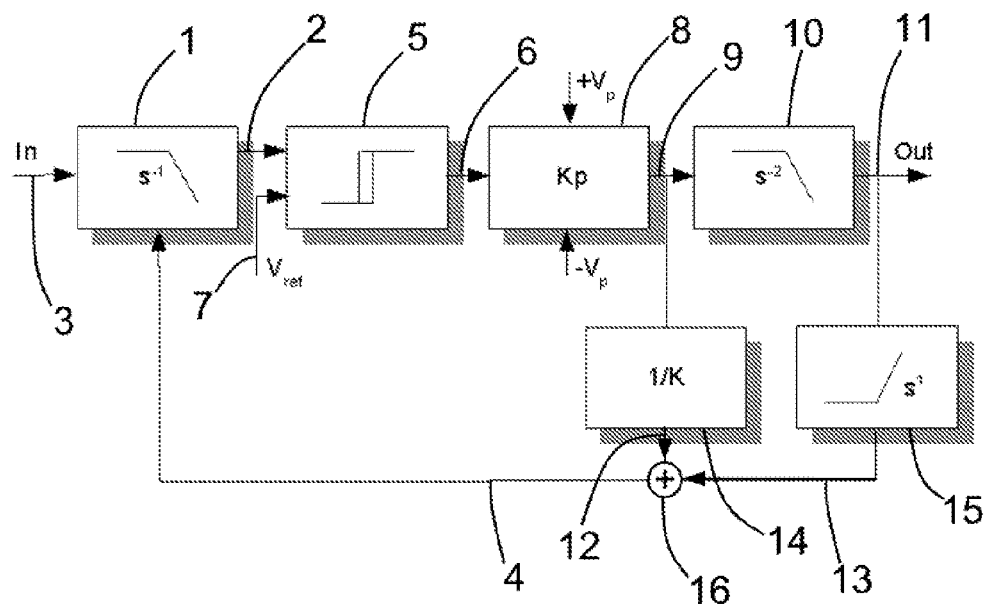
FIG. 6 shows a third embodiment of a pulse modulated converter according to the invention as a general block diagram, which in general terms describes the transfer functions of the complete control loop and modulator structure.

A third embodiment of the invention can be seen from FIG. 6. The first predetermined transfer function 14 of the local loop has been implemented only comprising a gain 1/K. In order to avoid prohibitive output impedance, the impedance of the local loop must be higher than the DC impedance of the second predetermined transfer function 15 of the global loop. This is important in order to ensure that the error sensitivity at the output of the output filter 10 is low. The DC impedance of the second predetermined transfer function 15 of the global loop should be a factor C smaller than the DC impedance of the first transfer function 34 of the local loop. C should preferably be in the range of 5-10. The regulator 1 can be implemented with at least a pole. The pole can preferably be placed at very low frequencies, so as to obtain an integrating transfer function R(s). If further modulator linearity is needed, the regulator 1 can also comprise at least a zero at higher frequencies, as compared to the pole placement of regulator 1.

At high output signal amplitudes the control signal 2 might be slightly distorted, but the distortion will be compensated by the high open loop gain.

Figure 7:
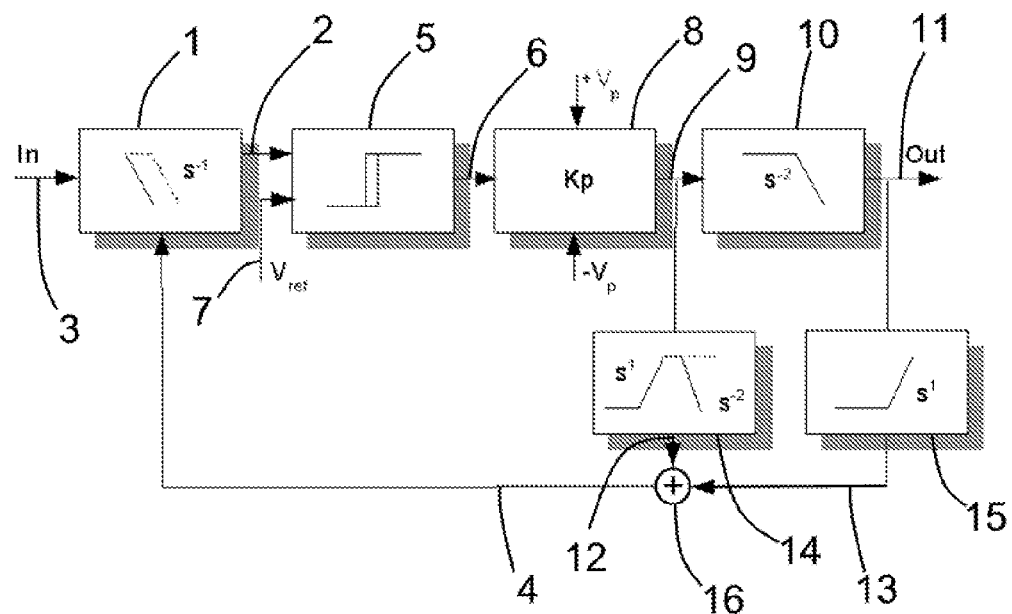
FIG. 7 shows a fourth embodiment of a pulse modulated converter according to the invention as a general block diagram, which in general terms describes the transfer functions of the complete control loop and modulator structure.

A fourth embodiment of a pulse modulated converter according to the invention can be seen from FIG. 7. Here, the second predetermined transfer function 15 of the global loop is implemented with a zero in order to have sufficient stability.

The second predetermined transfer function 15 of the local loop is implemented with a zero and at least 1 pole. This creates a band-pass function in the case where two poles are placed in the second predetermined transfer function 14 of the local loop, or a lead-lag function in the case where only one pole has been implemented. The basis for the local loop feedback signal can be the voltage from the power stage 8 or it can be the current into the output filter inductor. The current can be measured by a traditional current measurement as obvious to the skilled engineer or the voltage can be measured over the output filter inductor and said voltage can then be integrated to provide a virtual current measurement. The current into the output filter inductor will in any case be represented as a voltage.

The regulator 1 is implemented with at least one pole, providing in its simplest form a low pass filter function.

Returning now to FIG. 9, waveforms of various signals in the pulse modulated converter of FIG. 5 are shown. The signals are represented for a situation where the pulse modulated converter is idle, i.e. without an input signal 3. The signals are represented on the same time scale, so that different signals at various points in the converter can be compared. The skilled person, however, will immediately recognize that they are not drawn to same voltage scale.

From top to bottom of FIG. 9, the represented signals from FIG. 5 are: the output signal 9 of the power stage 8, the analog output signal 11 from the demodulating output filter 10, the second feedback signal 12 of the local loop, the third feedback signal 13 of the global loop, the first feedback signal 4 as formed by the summation in the summation point 16 and the control signal 2 from the regulator 1.

As can be seen the output signal 9 of the power stage 8 comprises a sequence of square pulses with a duty cycle of 0.5, corresponding to the idle situation of the pulse modulated converter. After the output filter 10 the analog output signal 11 comprises a DC signal, with a sinusoid ripple corresponding to the switching residual of the pulse modulated converter. It should be noted that the sinusoid ripple shown, is just a ripple far beyond the audible area, e.g. about 500 kHz, and thus not audible in the output signal 11.

Below the analog output signal 11, the second feedback signal 12 is shown. The shape of the second feedback signal 12 is the result of the filtering of the output signal 9 of the power stage 8 through the first predetermined transfer function 14.

Below the second feedback signal 12, the third feedback signal 13, is shown. The shape of the third feedback signal 13 is the result of the filtering of the analog output signal 11 of the output filter 10 through the second predetermined transfer function 15. Here it should be noted that for illustration purposes the second feedback signal 12 and the third feedback signal 13 are not drawn to scale.

Below the third feedback signal 13, the first feedback signal 4 is shown as the sum of the second feedback signal 12 and the third feedback signal 13.

Finally, at the bottom of FIG. 9, the control signal 2 generated by the regulator 1 is shown. The regulator integrates the difference between the input signal 3, which is in this case zero, and the first feedback signal 4, in order to provide the control signal 2.

Figure 8:
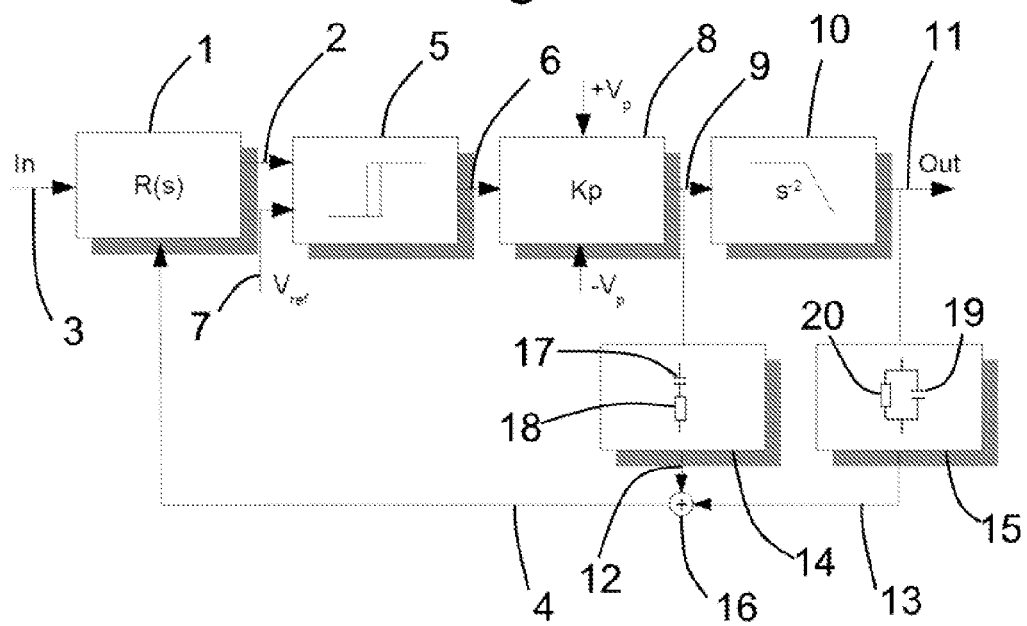
FIG. 8 shows a possible implementation of the first and second predetermined transfer functions of FIG. 5.

One simple way of implementing the first predetermined transfer function 14 and the second predetermined transfer function 15 is illustrated in FIG. 8. Here both transfer functions are implemented as RC filters. The first predetermined transfer function 14 is implemented as an RC filter comprising a series connection of a capacitor 17 and a resistor 18. The second predetermined transfer function 15 is implemented as an RC filter comprising a parallel connection of a capacitor 19 and a resistor 20.

Though the invention has been described in detail using specific examples, these are not to be taken as limiting the invention in any way. Rather, the skilled person will be able to identify numerous variations, without departing from the scope of the invention. In particular the skilled person will readily be able to choose combinations of poles and zeroes and locations thereof, in order to implement the invention in various applications.

The invention claimed is:

1. A pulse modulated converter comprising an input stage for generating a first control signal based on an input signal and a first feedback, and
    a comparator for generating a pulse width modulated signal based on said first control signal and a reference signal,
    means for providing a hysteresis when generating the pulse width modulated,
    a power stage for generating an amplified pulse width modulated signal,
    an output filter for filtering said amplified pulse width modulated signal, so as to create an analog output signal,
    wherein said first feedback signal is formed as a combination of a second feedback signal and a third feedback signal,
    said second feedback signal being derived from the amplified pulse width modulated signal using a first predetermined transfer function, and
    said third feedback signal being derived from the analog output signal using a second predetermined transfer function,
    where said second predetermined transfer function comprises at least one zero.

2. A pulse modulated converter according to claim 1, wherein said first predetermined transfer function comprises at least one zero.

3. A pulse modulated converter according to claim 1, wherein said first predetermined transfer function comprises at least one pole and at least one zero.

4. A pulse modulated converter according to claim 1, wherein the first predetermined transfer function comprises a transfer function gain, comprising neither poles nor zeroes.

5. A pulse modulated converter according to claim 1, wherein the first predetermined transfer function comprises at least one pole and a zero.

6. A pulse modulated converter according to claim 1, wherein said input stage comprises an integrator for integrating the signal difference between said input signal and said feedback signal, and means for outputting the resulting signal of said integration as the control signal.

7. A pulse modulated converter according to claim 2, wherein the first predetermined transfer function in a single ended implementation has been implemented using at least one resistor in series with a capacitor, and wherein the second predetermined transfer function has been implemented using at least one capacitor in parallel with a resistor.

8. A pulse modulated converter according to claim 1, where first predetermined transfer function is implemented using a negative voltage feedback loop.

9. A pulse modulated converter according to claim 5, wherein the first predetermined transfer function is implemented using a negative current feedback loop.

10. A pulse modulated converter according to claim 1, wherein the input stage comprises at least a pole implemented at very low frequencies.

11. A pulse modulated converter according to claim 1, wherein the first predetermined transfer function is implemented with a DC-impedance, which exceeds the DC-impedance, with which the second predetermined transfer function is implemented, by at least a factor of 5.

12. A pulse modulated converter according to claim 1, wherein the input stage has been implemented using at least one pole and at least one zero.

* * * * *